United States Patent [19]

Hascoe

[11] 4,283,464
[45] Aug. 11, 1981

[54] PREFABRICATED COMPOSITE METALLIC HEAT-TRANSMITTING PLATE UNIT

[76] Inventor: Norman Hascoe, 791 Weaver St., Larchmont, N.Y. 10538

[21] Appl. No.: 37,236

[22] Filed: May 8, 1979

[51] Int. Cl.³ .......................... B21D 39/00; B32B 3/12
[52] U.S. Cl. ...................................... 428/594; 357/81; 428/614; 428/620; 428/929
[58] Field of Search .............. 428/594, 597, 614, 620, 428/929; 357/81

[56] References Cited

U.S. PATENT DOCUMENTS

| | | | |
|---|---|---|---|
| 2,391,457 | 12/1945 | Carlson | 428/614 X |
| 2,501,164 | 3/1950 | Durst | 428/929 X |
| 2,794,458 | 6/1957 | Dosker | 428/614 |
| 3,128,419 | 4/1964 | Waldkötter et al. | 357/81 |
| 3,175,893 | 3/1965 | Meretsky | 428/620 X |
| 3,351,700 | 11/1967 | Savolainen et al. | 428/620 X |
| 3,399,332 | 8/1968 | Savolainen | 357/81 |
| 3,769,179 | 10/1973 | Durose et al. | 204/24 |

Primary Examiner—Richard D. Lovering
Attorney, Agent, or Firm—Laurence B. Dodds

[57] ABSTRACT

A prefabricated composite metallic plate unit for transmitting heat from a heat source to a heat-absorbing medium and having a relatively high heat-transfer coefficient comprises a pair of high-tensile-strength plate members of a cobalt-nickel-iron or similar type alloy having a temperature coefficient of expansion of about $6.2 \times 10^{-6}/°C$. over a temperature range of about 30° C. to 550° C. and a tensile strength of at least 35 kg/mm². A plurality of holes extend through each of the plate members and have an aggregate area of about 70% of the surface areas thereof, such holes numbering about 2000 per square inch. A layer of relatively malleable metallic material is interposed between the plate members and fills the holes. Such metallic material is a metal of the group consisting of copper, aluminum, gold, silver, and an alloy of any of such metals. The resulting composite metallic plate unit has a heat-transfer coefficient of at least about 0.3 cal./cm²/cm/sec./°C.

9 Claims, 1 Drawing Figure

PREFABRICATED COMPOSITE METALLIC HEAT-TRANSMITTING PLATE UNIT

CROSS-REFERENCE TO RELATED APPLICATION

This invention relates to a composite metallic heat-transmitting plate unit of the general type described and claimed in Applicant's copending application Ser. No. 811,084, filed June 29, 1977, entitled "A Prefabricated Composite Metallic Heat-Transmitting Plate Unit", and constitutes an alternative construction suitable for certain applications, particularly such applications in which the plate unit is subjected to a relatively high cycling range of temperatures of the order of 550° C.

BACKGROUND OF THE INVENTION

As explained in aforesaid copending application, in the transfer of heat from a heat source to a heat-absorbing body, it is often desirable or even necessary in certain applications to employ an intermediary metallic member having a temperature coefficient of expansion approximately equal to that of the heat source but a relatively high heat-transfer characteristic. As explained in such copending application, such a heat-transmitting metallic plate unit has particular utility in the mounting of single-crystal silicon semiconductor devices.

The heat-transmitting metallic plate unit specifically described in aforesaid copending application comprised a plate of high-tensile-strength metal having a desirable coefficient of thermal expansion but undesirably low coefficient of heat transfer fabricated by filling holes in the plate with a malleable metal having a high coefficient of heat transfer such as copper, silver, aluminum, gold, or alloys of such metals. The holes were filled by electroplating, passing the metals through a rolling mill to force the malleable material into the holes, pouring the molten malleable metal into the holes, or by other means.

Such composite structure has the desired characteristics of controlled coefficient of thermal expansion and relatively high coefficient of heat transfer. It has found many applications where the range of temperature over which the device in which the structure is incorporated is relatively moderate, for example extending to a maximum temperature cycling range of the order of 400° C. However, when operation over a higher range of cycling temperatures is required, it has been found that a small percentage of the malleable metal inserts become detached from the high-tensile-strength matrix material. As a result of the loss of contact between the two metals, the coefficient of heat transfer becomes degraded.

It is an object of the invention, therefore, to provide a new and improved prefabricated composite heat-transmitting metallic plate unit which overcomes the foregoing temperature limitation characteristic of the metallic plate unit described and claimed in aforesaid copending application and operates satisfactorily over a higher range of cycling temperatures, for example 550° C.

SUMMARY OF THE INVENTION

In accordance with the invention, there is provided a prefabricated composite metallic plate unit for transmitting heat from a heat source to a heat-absorbing medium, having opposed planar surfaces adapted individually to engage the heat source and the heat-absorbing medium, and having a relatively high heat-transfer coefficient, such plate unit comprising a pair of high-tensile-strength metallic plate members having a temperature coefficient of expansion approximately the same as that of the heat source, a plurality of holes extending through each of such plate members, and a layer of relatively malleable metallic material interposed between the pair of plate members and filling the holes thereof and having a heat-transfer coefficient of at least about 0.3 cal./cm$^2$/cm/sec./°C.

For a better understanding of the present invention, together with other and further objects thereof, reference is had to the following description, taken in connection with the accompanying drawing, while its scope will be pointed out in the appended claims.

BRIEF DESCRIPTION OF THE DRAWING

The single FIGURE of the drawing is a perspective view, partially cut away, of a prefabricated composite metallic plate unit embodying the present invention.

DESCRIPTION OF THE PREFERRED EMBODIMENT

Figure 1:
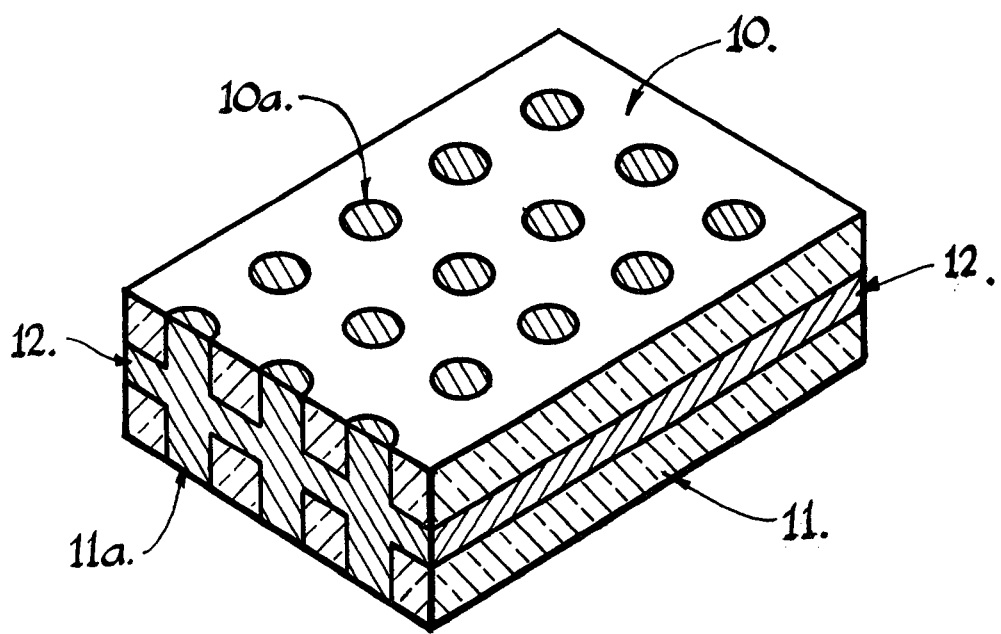

Referring now to the drawing, there is illustrated a prefabricated composite metallic plate unit for transmitting heat from a heat source to a heat-absorbing medium and having a relatively high heat-transfer coefficient which comprises a pair of high-tensile-strength metallic plate members 10 and 11. Each of the plate members is of a material having a temperature coefficient of expansion approximately the same as that of the heat source and is preferably a cobalt-nickel-iron alloy commercially available as KOVAR or nickel-iron alloy consisting of 42% nickel and 58% iron, commercially available as Alloy 42. Each has a temperature coefficient of expansion compatible with single-crystal silicon with KOVAR having a coefficient of $6.2 \times 10^{-6}$/°C. and Alloy 42 having a coefficient of $6.9 \times 10^{-6}$/°C. over the temperature range of about 30° C. to 550° C. However, it is required that whatever material is selected for the plate members 10 and 11 must have a tensile strength of at least 35 kg/mm$^2$.

The plate members 10, 11 have a plurality of holes 10a, 11a extending therethrough and having an aggregate area of from 15% to 80%, preferably about 70%, of the surface areas of the plate members. The number of holes 10a and 11a may vary over a very wide range but, in one typical construction, the holes numbered about 2000 per square inch. The shape of the holes may be round as illustrated, square, oval, rectangular, diamond and variations of these shapes.

Interposed between the plate members 10 and 11 is a layer 12 of a malleable metallic material forming a sandwich structure. This malleable material is a metal of the group consisting of copper, aluminum, gold, silver, and an alloy of any of such metals, the metal copper being used in a typical example. In the fabrication of the plate units, the plates 10 and 11 are subjected to a high pressure such that the malleable center metal layer 12 is forced to flow into the holes of the high-tensile-strength outer plates, such pressure being applied by machines such as rolling mills or high-pressure presses.

The coefficients of heat transfer of various materials suitable for fabricating composite plates according to the present invention are as follows:

Aluminum = 0.50
Copper = 0.94

Gold = 0.74
Silver = 0.99
KOVAR = 0.04
Alloy 42 = 0.03

The measured coefficient of heat transfer of the composite heat-transmitting plate unit described above closely approximates that coefficient of heat transfer which may be calculated from theoretical considerations. The equation defining the coefficient of heat transfer for a body of uniform material is:

$K = q/A\Delta T = \text{cal.}/\text{cm}^2/\text{cm}/\text{sec.}/°C.$ with $K$ = coefficient of heat transfer
$q$ = calories of heat transferred per second
$A$ = ratio of the area in cm$^2$/length in cm
and $\Delta T$ = temperature differential across the two surfaces being considered in degrees Celsius.

A first order approximation to the effective coefficient of heat transfer of the composite is the sum of the coefficients of the two materials proportioned to the respective areas of the two materials, i.e., for a KOVAR (Ko) and copper (Cu) composite the equation would be:

$$K_{composite} = (^K Ko)(\% \text{ Ko area}) + (KC_u)(\% \text{ Cu area})$$

and the sum of % Ko area + % Cu area is normalized to 1.

As an example of the coefficient of heat transfer of a composite, assume the plate to be fabricated from KOVAR and copper with the thickness one centimeter and the copper center layer being very thin. Assume the copper area to be 70% and the KOVAR area 30%. The coefficient of the composite to a first order approximation is:

$$K_{composite} = (0.4)(0.03) + (0.94)(0.70) = (0.67 \text{ cal.}/\text{cm}^2/\text{cm}/\text{sec.}°C.$$

As can be seen, such a composite has a coefficient of heat transfer approximately 17 times that of KOVAR.

The dimensions of the plate unit illustrated in the drawing are grossly exaggerated for clarity of illustration. In practice, such dimensions may vary over wide ranges, depending upon the intended application. Typically, the plate members 10 and 11 are of a thickness of 0.002 inch to 0.050 inch and the thickness of the layer 12 of malleable metal is typically of a thickness of 0.003 inch to 0.060 inch.

One specific example of a plate unit embodying the invention and designed to operate over the temperature range of 20° C. to 550° C. has the following dimensions and characteristics:

| | |
|---|---|
| Thickness of KOVAR plates 10,11 | 0.008 inch |
| Thickness of copper layer 12 after processing | 0.004 inch |
| Area of copper-filled holes 10a,11a | 70% of plate area |
| Coefficient of heat transfer of solid KOVAR plate | 0.04 |
| Coefficient of heat transfer of composite plate unit | 0.67 |
| Coefficient of thermal expansion of solid KOVAR plate over the range 30° C. to 550° C. | 6.2 × 10$^{-6}$/°C. |
| Coefficient of thermal expansion of solid Alloy 42 over the range 30° C. to 550° C. | 6.9 × 10$^{-6}$/°C. |
| Coefficient of expansion of solid copper plate | 16.4 × 10$^{-6}$/°C. |
| Coefficient of thermal expansion of composite plate | 7.0 × 10$^{-6}$/°C. |

Thus it is seen that the heat-transfer coefficient of such composite plate unit is approximately 17 times that of a solid KOVAR plate.

It is estimated that 90% of all integrated circuit semiconductor chips which are manufactured are less than 0.300 inch by 0.300 inch in size. The slight difference between the thermal coefficients of expansion of the silicon chip and the composite plate unit is not great enough to cause significant strains in chips of 0.300 inch by 0.300 inch and smaller.

While there has been described what is, at present, considered to be the preferred embodiment of the invention, it will be obvious to those skilled in the art that various changes and modifications may be made therein, without departing from the invention, and it is, therefore, aimed in the appended claims to cover all such changes and modifications as fall within the true spirit and scope of the invention.

I claim:

1. A prefabricated composite metallic plate unit for transmitting heat from a heat source to a heat-absorbing medium, having opposed planar surfaces adapted individually to engage the heat source and the heat-absorbing medium, and having a relatively high heat-transfer coefficient, said plate unit comprising:

a pair of high-tensile-strength metallic plate members having a temperature coefficient of expansion approximately the same as that of said heat source;

a plurality of holes extending through each of said members;

and a layer of relatively malleable metallic material interposed between said members and filling said holes and having a heat-transfer coefficient of at least about 0.3 cal./cm$^2$/cm/sec./°C.

2. A heat-transmitting metallic plate unit in accordance with claim 1 in which each of said plate members is of a cobalt-nickel-iron alloy having a temperature coefficient of expansion of about 6.2 × 10$^{-6}$/°C. over a temperature range of about 30° C. to 550° C.

3. A heat-transmitting metallic plate unit in accordance with claim 1 in which each of said plate members is an alloy consisting substantially of 42% nickel and 58% iron and having a temperature coefficient of expansion of about 6.9 × 10$^{-6}$/°C. over a temperature range of about 30° C. to 550° C.

4. A heat-transmitting metallic plate unit in accordance with claim 1 in which each of said plate members has a tensile strength of at least about 35 kg/mm$^2$.

5. A heat-transmitting metallic plate unit in accordance with claim 1 in which the holes extending through the plate members are an aggregate area of from 15% to 80% of the surface areas of said plate members.

6. A heat-transmitting metallic plate unit in accordance with claim 1 in which the holes extending through the plate members have an aggregate area of about 70% of the surface areas of said plate members.

7. A heat-transmitting metallic plate unit in accordance with claim 1 in which the holes extending through the plate members number from 5 to 2000 per square inch.

8. A heat-transmitting metallic plate unit in accordance with claim 1 in which the holes extending through the plate members number about 2000 per square inch.

9. A heat-transmitting metallic plate unit in accordance with claim 1 in which said malleable metallic material is a metal of the group consisting of copper, aluminum, gold, silver and an alloy of any of such metals.

* * * * *